United States Patent
Kim et al.

(10) Patent No.: US 12,471,416 B2
(45) Date of Patent: Nov. 11, 2025

(54) LIGHT EMITTING DIODE CHIP HAVING DISTRIBUTED BRAGG REFLECTOR

(71) Applicant: Seoul Viosys Co., Ltd., Ansan-si (KR)

(72) Inventors: Ye Seul Kim, Ansan-si (KR); Sang Won Woo, Ansan-si (KR); Kyoung Wan Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 17/016,371

(22) Filed: Sep. 10, 2020

(65) Prior Publication Data

US 2020/0411725 A1 Dec. 31, 2020

Related U.S. Application Data

(63) Continuation of application No. 15/767,284, filed as application No. PCT/KR2016/006428 on Jun. 17, 2016, now Pat. No. 10,804,437.

(30) Foreign Application Priority Data

Oct. 23, 2015 (KR) .......................... 10-2015-0148036

(51) Int. Cl.
  *H10H 20/841* (2025.01)
  *G02B 6/293* (2006.01)
  *H10H 20/851* (2025.01)

(52) U.S. Cl.
  CPC ....... *H10H 20/841* (2025.01); *G02B 6/29394* (2013.01); *H10H 20/851* (2025.01)

(58) Field of Classification Search
  CPC ... H01L 33/44–46; H01L 33/00; H01L 33/50; G02B 6/29394–29395;
  (Continued)

(56) References Cited

U.S. PATENT DOCUMENTS 5,999,321 A * 12/1999 Bradley ............... G02B 27/283
                                                    348/E5.141
6,720,585 B1    4/2004 Wasserbauer et al.
(Continued)

FOREIGN PATENT DOCUMENTS

EP    2 648 237 A2   10/2013
EP    2 656 402      10/2013
(Continued)

OTHER PUBLICATIONS

Non-Final Office Action dated Aug. 7, 2019, issued to U.S. Appl. No. 15/767,284.
(Continued)

*Primary Examiner* — Eric K Ashbahian
(74) *Attorney, Agent, or Firm* — Oblon, McClelland, Maier & Neustadt, L.L.P.

(57) ABSTRACT

A light emitting diode chip including a light emitting structure and a distributed Bragg reflector (DBR) having first, second, and third regions and including first material layers having a low index of refraction and second material layers having a high index of refraction, in which the first material layers include a first group having an optical thickness greater than 0.25λ+10%, a second group having an optical thickness in a range of 0.25λ−10% to 0.25λ+10%, and a third group having an optical thickness less than 0.25λ−10%, the first region has alternately disposed first and second groups, the second region has the third group, the first material layers in the third region have a first material layer having an optical thickness less than 0.25λ and greater than 0.25λ, the second material layers have a smaller average optical thickness than the first group of the first material layers.

19 Claims, 15 Drawing Sheets

(58) Field of Classification Search
CPC ..... G02B 5/0816; G02B 5/0861; H01S 5/187; H01S 5/125; H01S 5/18327; H01S 5/18361; H10H 20/841
See application file for complete search history.

(56) References Cited

U.S. PATENT DOCUMENTS

| | | | |
|---|---|---|---|
| 8,772,805 | B2 | 7/2014 | Ye et al. |
| 9,368,937 | B1 | 6/2016 | Tamanuki |
| 10,804,437 | B2* | 10/2020 | Kim ............ H01L 33/46 |
| 2002/0163952 | A1 | 11/2002 | Hwang et al. |
| 2003/0015713 | A1 | 1/2003 | Yoo |
| 2004/0113156 | A1* | 6/2004 | Tamura .......... H01L 33/42 |
| | | | 257/79 |
| 2008/0179605 | A1 | 7/2008 | Takase et al. |
| 2009/0148688 | A1 | 6/2009 | Sasaki et al. |
| 2010/0140636 | A1* | 6/2010 | Donofrio ........ H01L 33/22 |
| | | | 257/E27.001 |
| 2011/0037825 | A1 | 2/2011 | Jikutani et al. |
| 2011/0127549 | A1 | 6/2011 | Lee et al. |
| 2011/0164308 | A1 | 7/2011 | Arsenault et al. |
| 2011/0284822 | A1* | 11/2011 | Jung ............. H01L 33/56 |
| | | | 257/13 |
| 2012/0097967 | A1* | 4/2012 | Choi ............ H10D 86/60 |
| | | | 438/34 |
| 2012/0161176 | A1* | 6/2012 | Heo ........... H10H 20/841 |
| | | | 257/98 |
| 2012/0286309 | A1 | 11/2012 | Chae et al. |
| 2013/0058102 | A1 | 3/2013 | Lin |
| 2013/0256720 | A1 | 10/2013 | Ockenfuss |
| 2014/0203318 | A1 | 7/2014 | Matsui et al. |
| 2014/0226311 | A1* | 8/2014 | Ono ............... F21V 7/04 |
| | | | 362/296.05 |
| 2014/0316330 | A1 | 10/2014 | Fudem et al. |
| 2014/0377459 | A1* | 12/2014 | Kawashima ...... G01N 21/1702 |
| | | | 399/221 |
| 2015/0108492 | A1 | 4/2015 | Kuo |
| 2015/0357525 | A1 | 12/2015 | Sasaki |
| 2015/0362652 | A1* | 12/2015 | Hayashi ......... G02B 6/0088 |
| | | | 348/790 |
| 2016/0087159 | A1* | 3/2016 | Kim ............ H01L 33/46 |
| | | | 257/98 |
| 2016/0099388 | A1* | 4/2016 | Jung ............. H01L 33/54 |
| | | | 438/16 |
| 2017/0082892 | A1* | 3/2017 | Chung .......... G02F 2/02 |
| 2018/0040789 | A1* | 2/2018 | Kim ............ H01L 33/62 |

FOREIGN PATENT DOCUMENTS

| | | |
|---|---|---|
| JP | 10-270754 A | 10/1998 |
| JP | 2003-270432 A | 9/2003 |
| JP | 2008-191592 A | 8/2008 |
| JP | 2008-211164 A | 9/2008 |
| JP | 2009-088299 | 4/2009 |
| JP | 2011-166146 A | 8/2011 |
| JP | 2013-171992 | 9/2013 |
| JP | 2013-214742 A | 10/2013 |
| JP | 2014-500629 A | 1/2014 |
| JP | 2014-139997 A | 7/2014 |
| JP | 2014-524674 | 9/2014 |
| KR | 10-2011-0053064 | 5/2011 |
| KR | 10-2012-0011171 A | 2/2012 |
| KR | 10-2012-0072711 | 7/2012 |
| KR | 10-1289442 | 7/2013 |
| KR | 10-1289442 B1 | 7/2013 |
| WO | WO 2011/099771 A2 | 8/2011 |

OTHER PUBLICATIONS

Final Office Action dated Jan. 15, 2020, issued to U.S. Appl. No. 15/767,284.
Notice of Allowance dated May 11, 2020, issued to U.S. Appl. No. 15/767,284.
International Search Report mailed Sep. 29, 2016, in PCT Application No. PCT/KR2016/006428.
Written Opinion mailed Sep. 29, 2016, in PCT Application No. PCT/KR2016/006428.
The Extended European Search Report dated Mar. 29, 2019, issued in European Patent Application No. 16857630.4.
Examination Report Under Sections 12 & 13 of the Patents Act issued Feb. 26, 2019 in corresponding Indian Application No. 201634021277.
Zhao et al., "Efficiency Enhancement of InGaN/GaN Light-Emitting Diodes with a Back-Surface Distributed Bragg Reflector," Journal of Electronic Materials, vol. 32, Issue No. 12, 2003, pp. 1523-1526.
Japan Office Action dated Jul. 21, 2020, issued to Japanese Patent Application No. 2018-002039.
Japanese Notice of Reasons for Refusal issued Aug. 22, 2017 in Japanese Patent Application No. 2016-162217 (with English Translation), 6 pages.
Japanese Notice of Reasons for Refusal issued Jul. 21, 2020 in Japanese Patent Application No. 2018-002039 (with English Translation), 6 pages.

* cited by examiner

LIGHT EMITTING DIODE CHIP HAVING DISTRIBUTED BRAGG REFLECTOR

CROSS-REFERENCE TO RELATED APPLICATIONS

This application is a Continuation of U.S. patent application Ser. No. 15/767,284, filed on Apr. 10, 2018, which is the National Stage Entry of International Patent Application No. PCT/KR2016/006428, filed on Jun. 17, 2016, and claims priority from and the benefit of Korean Patent Application No. 10-2015-0148036, filed on Oct. 23, 2015, each of which is incorporated by reference for all purposes as if fully set forth herein.

BACKGROUND

Field

Exemplary embodiments of the invention relate generally to a light emitting diode chip, and more particularly, to a light emitting diode chip that includes a distributed Bragg reflector in order to improve light extraction efficiency.

Discussion of the Background

A GaN-based light emitting diode configured to emit blue light or UV light is used in various applications, and particularly, various kinds of light emitting diode packages configured to emit mixed light, for example, white light, for a backlight unit or general lighting are commercially available in the market.

Since light output of a light emitting diode package generally depends on luminous efficacy of a light emitting diode chip, continuous attempts have been made to improve luminous efficacy of the light emitting diode chip. For example, a rough surface is formed on one surface of a light exit plane, or the shape of an epitaxial layer or a transparent substrate is modified in order to improve light extraction efficiency of the light emitting diode chip.

Alternatively, a metal reflector, for example, an Al reflector, is provided to the other surface of the light exit plane, for example, a lower surface of a substrate, in order to improve luminous efficacy through reflection of light traveling towards a chip mounting plane to reduce light loss through reflection of light using the metal reflector. However, such a reflective metal is likely to suffer from deterioration in reflectance due to oxidation, and the metal reflector has relatively low reflectance.

Accordingly, a distributed Bragg reflector (DBR) formed by alternately stacking materials having different indices of refraction is used in order to achieve high reflectance while securing relatively stable reflection characteristics.

A DBR is generally formed by alternately stacking high refractive material layers and low refractive material layers. Particularly, a DBR having high reflectance in a certain spectrum range including a central wavelength, that is, in the stop band, can be formed by alternately stacking high refractive material layers and low refractive material layers each having an optical thickness (actual thickness×index of refraction) equal to $\lambda/4$ ($\lambda$: central wavelength).

However, the stop band cannot be sufficiently widened simply by alternately stacking the high refractive material layers and the low refractive material layers each having an optical thickness equal to $\lambda/4$. In order to overcome this problem, the stop band can be widened by stacking a DBR1 for longer wavelengths than the central wavelength and a DBR2 for shorter wavelengths than the central wavelength, thereby providing a DBR exhibiting high reflectance substantially over the entire visible range. Thickness of each layer of the DBR can be finely adjusted using a simulation tool, such as Macleod or Filmstar.

FIG. 1 is a simulation graph illustrating a process of designing a DBR having a relatively wide stop band by stacking a DBR1 and a DBR2 using a simulation tool.

In order to design a DBR having a reflectance of 90% or higher in a wavelength band of 425 nm to 700 nm, first, with reference to the central wavelength ($\lambda$) of 555 nm, a DBR1 exhibiting high reflectance in a wavelength band of 555 nm to 700 nm and a DBR2 exhibiting high reflectance in a short wavelength band of 555 nm or less are designed and stacked one above another. Here, the thickness of each material layer in the DBR1 and the DBR2 is adjusted using a simulation tool, thereby enabling design of the DBR having a reflectance of 90% or higher in a wavelength band of 425 nm to 700 nm.

In a structure where a GaN-based light emitting structure including an active layer is formed on a sapphire substrate, and a DBR is provided to a lower surface of the substrate, some of light emitted from the active layer reaches the reflector after passing through the substrate. In this case, light enters the reflector not only at an angle of incidence of 0° (at a right angle with respect to the reflector) but also at various angles of incidence. Particularly, in the structure where the sapphire substrate is a patterned sapphire substrate, the amount of light entering the reflector at an inclined angle of incidence may increase than those at a right angle.

FIG. 2 is a graph depicting light power depending upon an angle of incidence of light reaching a lower surface of a substrate. In this graph, Ex indicates an angle of incidence in the X direction on the lower surface of the substrate, and Ez indicates an angle of incidence in the Z direction perpendicular to the X direction on the lower surface of the substrate. Based on actual dimensions of a light emitting diode chip including a patterned sapphire substrate, light power was analyzed at intervals of 10° depending upon the angle of incidence of light reaching the lower surface of the substrate by using finite-difference time-domain (FDTD) numerical analysis.

Referring to FIG. 2, light power of light incident generally at a right angle on the lower surface of the substrate, that is, at an angle of incidence of 0° to 10°, is less than about 3.5%. Conversely, light power of light incident at an angle of 20° or more, particularly, at an angle of incidence in the range of 20° to 50°, is about 60% or higher, which occupies the most power of light reaching the lower surface of the substrate. In the structure adopting the patterned sapphire substrate (PSS), light is scattered by a pattern formed on the substrate, thereby increasing the angle of incidence of light reaching the lower surface of the substrate. Accordingly, in the structure adopting the patterned sapphire substrate (PSS), since substantial amount of light reach the lower surface of the substrate at a relatively high angle of incidence, the DBR configured to reflect light incident on the lower surface of the substrate must be designed by taking the angle of incidence of light into account.

On the other hand, a typical DBR exhibits a high reflectance of about 100% over a wide range of wavelengths with respect to light entering at an angle of incidence of 0°. However, as the angle of incidence varies, the stop band of the DBR is shifted towards short wavelengths and the spectrum bandwidth of the stop band is narrowed. Moreover, the typical DBR suffers from a ripple phenomenon causing reduction in reflectance even within the stop band.

FIGS. 3A, 3B, and 3C are simulation graphs depicting variation in reflectance of a typical DBR depending upon an angle of incidence.

Referring to FIGS. 3A, 3B, and 3C, it can be seen that the stop band is shifted towards short wavelengths, and the bandwidth of the stop band is narrowed with increasing angle of incidence to 20°, 25°, and 30°. For example, at an angle of incidence of 20°, the stop band is shifted left by about 65 nm in the long wavelength band and by about 20 nm in the short wavelength band, and thus, the bandwidth of the stop band is reduced by about 45 nm. In addition, at an angle of incidence of 25°, the stop band is shifted left by about 90 nm in the long wavelength band and by about 25 nm in the short wavelength band, and thus, the bandwidth of the stop band is reduced by about 65 nm. Further, at an angle of incidence of 30°, the stop band is shifted left by about 120 nm in the long wavelength band and by about 30 nm in the short wavelength band, and thus, the bandwidth of the stop band is reduced by about 90 nm. As such, it is anticipated that the bandwidth of the stop band will be further reduced with an increasing angle of incidence.

On the other hand, as the angle of incidence increases from 20° to 30°, ripples R having relatively low reflectance are observed in the stop band. It can be seen that the reflectance in the ripples R gradually decreases with increasing angle of incidence. In addition, the ripples R are also shifted towards short wavelengths with increasing angle of incidence. Accordingly, for example, in a light emitting diode chip emitting light having a wavelength ($\lambda_e$) of about 450 nm, reflectance with respect to light entering at an angle of incidence of 20° to 50° can be rapidly reduced by the ripples R even when the stop band includes 450 nm.

SUMMARY

Exemplary embodiments of the present invention provide a light emitting diode chip that includes a DBR exhibiting good reflectance with respect not only to light entering at a right angle but also to light entering at various angles of incidence in order to improve luminous efficacy.

Exemplary embodiments of the present invention also provide a distributed Bragg reflector that can prevent or suppress generation of ripples exhibiting low reflectance with an increasing angle of incidence in the stop band.

An exemplary embodiment of the present invention provides a light emitting diode chip including: a light emitting structure including an active layer; and a distributed Bragg reflector (DBR) disposed at one side of the light emitting structure so as to reflect light emitted from the light emitting structure, wherein the DBR includes first material layers having a high index of refraction and second material layers having a low index of refraction, the first and second material layers being alternately stacked one above another, and, with respect to a central wavelength ($\lambda$: 554 nm) of the visible range, includes: a first region in which a first group of first material layers having an optical thickness greater than 0.25$\lambda$+10% and a second group of first material layers having an optical thickness greater than 0.25$\lambda$−10% and less than 0.25$\lambda$+10% are alternately arranged; a second region including a third group of first material layers having an optical thickness less than 0.25$\lambda$−10% and consecutively arranged; and a third region disposed between the first region and the second region and including a first material layer having an optical thickness less than 0.25$\lambda$−10% and a first material layer having an optical thickness greater than 0.25$\lambda$, the first region being placed closer to the light emitting structure than the second region.

Another exemplary embodiment of the present invention provides a light emitting diode chip including: a light emitting structure including an active layer emitting light having a first wavelength; and a distributed Bragg reflector (DBR) disposed at one side of the light emitting structure so as to reflect light emitted from the light emitting structure, wherein the DBR includes first material layers having a low index of refraction and second material layers having a high index of refraction, the first and second material layers being alternately stacked one above another, and, with respect to a second wavelength (k) longer than the first wavelength by 75 nm to 125 nm, comprises: a first region in which a first group of first material layers having an optical thickness greater than 0.25$\lambda$+10% and a second group of first material layers having an optical thickness greater than 0.25$\lambda$−10% and less than 0.25$\lambda$+10% are alternately arranged; a second region including a third group of first material layers having an optical thickness less than 0.25$\lambda$−10% and consecutively arranged; and a third region disposed between the first region and the second region and including a first material layer having an optical thickness less than 0.25$\lambda$−10% and a first material layer having an optical thickness greater than 0.25$\lambda$, the first region being placed closer to the light emitting structure than the second region.

DETAILED DESCRIPTION

Figure 1:
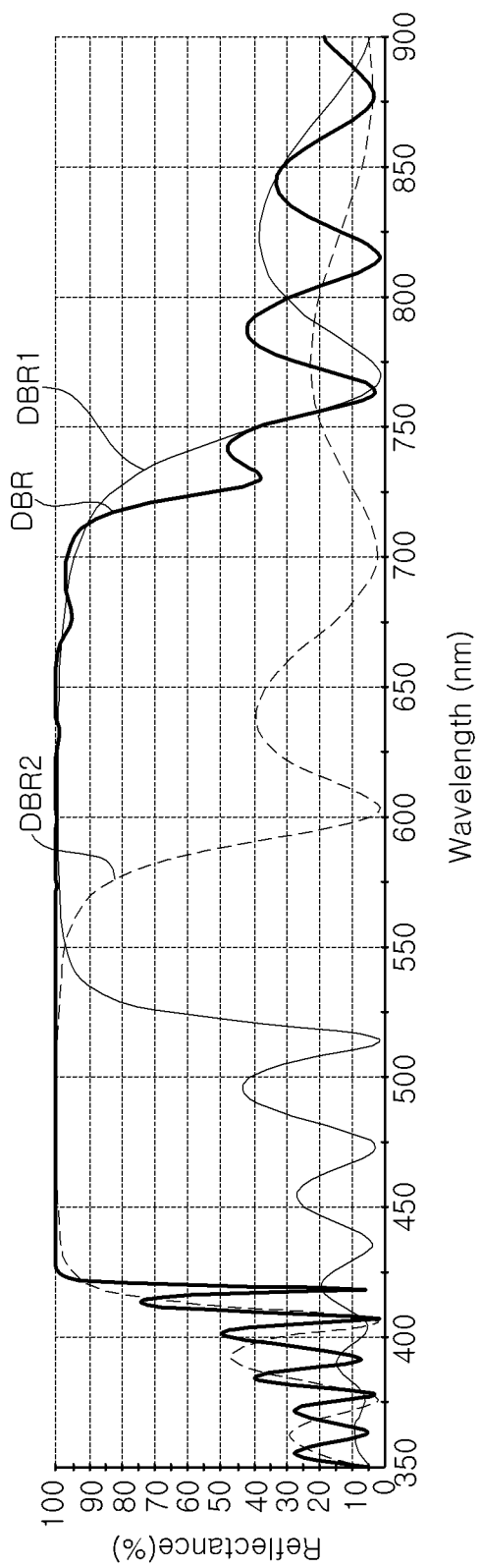
FIG. 1 is a simulation graph illustrating a process of designing a DBR having a relatively wide stop band by stacking a DBR1 and a DBR2 using a simulation tool.
Figure 2:
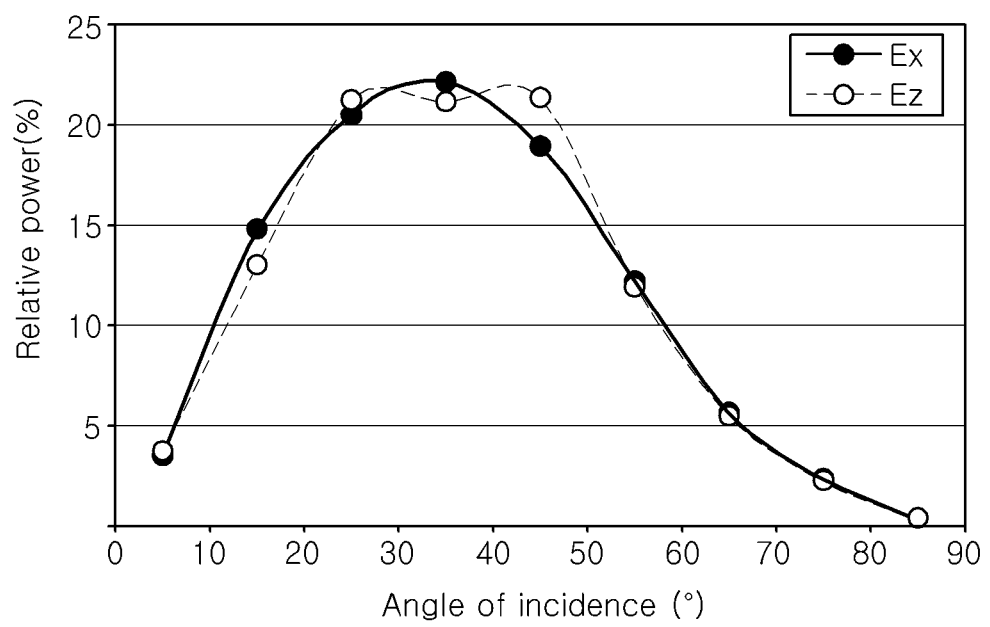
FIG. 2 is a graph depicting light power depending upon an angle of incidence of light reaching a lower surface of a substrate.
Figure 3A:
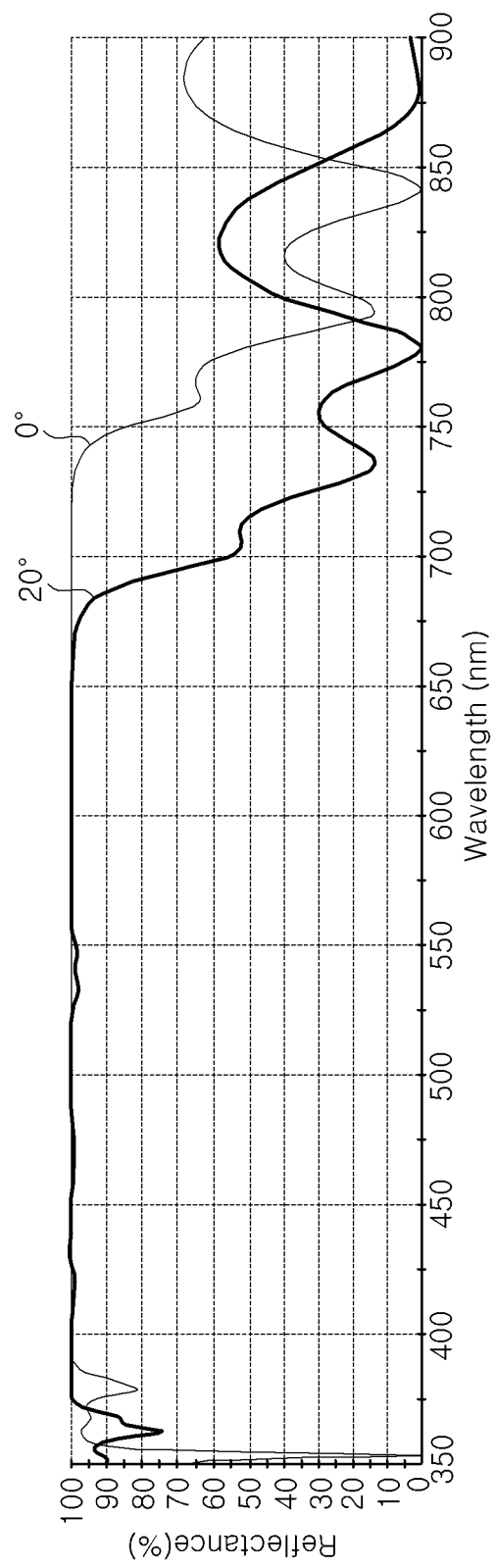
FIGS. 3A, 3B, and 3C are simulation graphs depicting variation in reflectance of a typical DBR depending upon an angle of incidence.
Figure 3B:
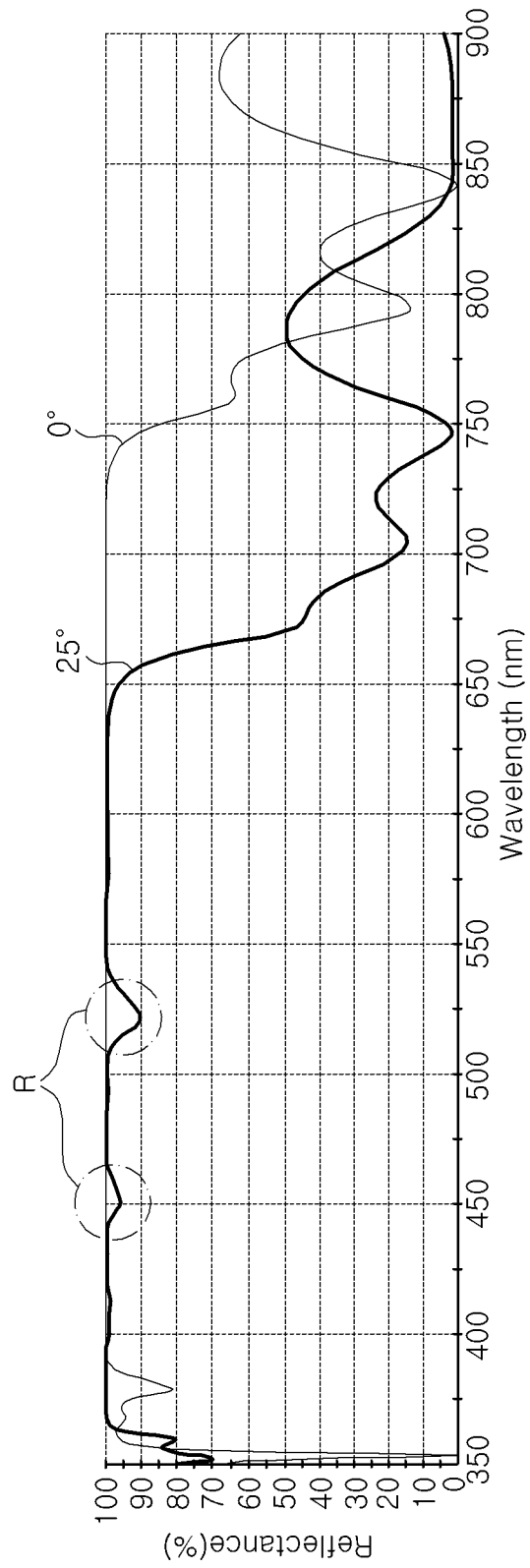
Figure 3C:
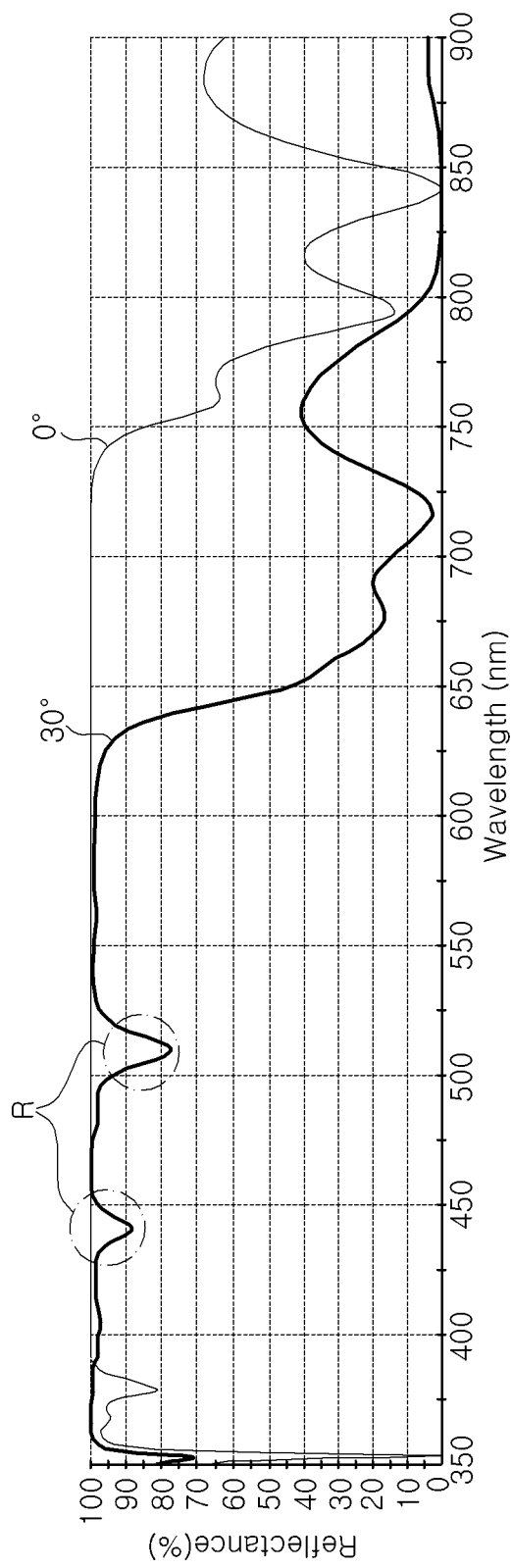

Hereinafter, exemplary embodiments of the present invention will be described in detail with reference to the accompanying drawings. The following embodiments are provided by way of example so as to fully convey the spirit of the present invention to those skilled in the art to which the present invention pertains. Accordingly, the present invention is not limited to the embodiments disclosed herein and can also be implemented in different forms. In the drawings, bandwidths, lengths, thicknesses, and the like of elements can be exaggerated for clarity and descriptive purposes. Throughout the specification, like reference numerals denote like elements having the same or similar functions.

In accordance with an exemplary embodiment of the present invention, a light emitting diode chip includes: a light emitting structure including an active layer; and a distributed Bragg reflector (DBR) disposed at one side of the light emitting structure so as to reflect light emitted from the light emitting structure. In this exemplary embodiment, the DBR includes first material layers having a high index of refraction and second material layers having a low index of refraction, in which the first and second material layers are alternately stacked one above another. With respect to a central wavelength ($\lambda$: 554 nm) of the visible range, the DBR includes: a first region including a first group of first material layers having an optical thickness greater than $0.25\lambda+10\%$ and a second group of first material layers having an optical thickness greater than $0.25\lambda-10\%$ and less than $0.25\lambda+10\%$ are alternately arranged; a second region including a third group of first material layers having an optical thickness less than $0.25\lambda-10\%$ are consecutively arranged; and a third region disposed between the first region and the second region and including a first material layer having an optical thickness less than $0.25\lambda-10\%$ and a first material layer having an optical thickness greater than $0.25\lambda$. The first region is placed closer to the light emitting structure than the second region.

In the first region, the first material layers are divided into the first group of first material layers having an optical thickness greater than $0.25\lambda+10\%$ and the second group of first material layers having an optical thickness near $0.25\lambda$, and these groups are alternately arranged, thereby improving reflection characteristics of the DBR near the central wavelength ($\lambda$) and in a spectrum range having longer wavelengths than the central wavelength. With this structure, the DBR can prevent occurrence of ripples in the stop band at various angles of incidence of light entering the DBR.

Further, the third region is disposed between the first region and the second region, thereby preventing occurrence of ripples near the center of the spectrum region.

On the other hand, the structure wherein the first region is disposed closer to the light emitting structure than the second region can improve reflection efficiency with respect to incident light in a wide spectrum range. This is because light having a shorter wavelength can more deeply permeate into the DBR than light having a longer wavelength.

Furthermore, the first group of first material layers may include first material layers having an optical thickness less than $0.3\lambda+10\%$ and the third group of first material layers may have an optical thickness greater than $0.2\lambda-10\%$. The first group of first material layers generally has an optical thickness near $0.3\lambda$, and the third group of first material layers generally has an optical thickness near $0.2\lambda$. Accordingly, the first group of first material layers increases reflectance in a longer wavelength range than the central wavelength, and the third group of the first material layers increases reflectance in a shorter wavelength range than the central wavelength.

According to exemplary embodiments, an optical thickness deviation of the first material layers in the first region is greater than that of the first material layers in the second region. The optical thickness deviation of the first material layers in the first region is increased by clearly dividing the optical thicknesses of the first group of first material layers and the optical thicknesses of the first material layers of the second group.

The second material layers in the first region include a first group of second material layers having an optical thickness greater than $0.25\lambda+10\%$ and a second group of second material layers having an optical thickness greater than $0.25\lambda-10\%$ and less than $0.25\lambda+10\%$. The second material layers in the second region include a third group of second material layers having an optical thickness less than $0.25\lambda-10\%$ are consecutively arranged, and the second material layers in the third region include a second material layer having an optical thickness less than $0.25\lambda-10\%$ and a second material layer having an optical thickness greater than $0.25\lambda$ and less than $0.25\lambda+10\%$.

In the first region, the second material layers may be divided into two groups like the first material layers. The second material layers may also include the first group of second material layers and the second group of second material layers, and the first group and the second group may be alternately arranged.

The first group of second material layers may have an optical thickness less than $0.25\lambda+20\%$. Furthermore, the first group of second material layers may have a smaller average optical thickness than the first group of first material layers.

In general, material layers having a high index of refraction have a higher light absorption rate than material layers having a low index of refraction. Accordingly, the optical thickness of the second material layers having a high index of refraction may be adjusted to be less than that of the first material layers having a low index of refraction in order to reduce light loss caused by light absorption. Particularly, in the first region having a relatively greater optical thickness, the thickness of the second material layers may be relatively reduced in order to achieve effective prevention of light loss caused by light absorption.

An optical thickness deviation of the second material layers in the first region is greater than that of the second material layers in the second region. In the first region, the second material layers may be divided into two groups having different optical thicknesses like the first material layers. On the contrary, in the second region, the second material layers have a substantially similar optical thickness, and thus, has a relatively small thickness deviation.

In some exemplary embodiments, the third region may further include second material layers having an optical thickness greater than 0.25λ+10%. In addition, the DBR may further include a first material layer disposed in the third region and having an optical thickness greater than 0.25λ−10% and less than 0.25λ.

The first region includes fewer layers than the first region and the second region. However, the layers in the third region may have more various optical thicknesses than the first region or the second region.

In some exemplary embodiments, the light emitting diode chip may further include a substrate disposed between the light emitting structure and the DBR. The substrate may be a patterned sapphire substrate (PSS). Light enters the DBR at an angle of incidence in the range of 20° to 50°, whereby the light emitting diode chip can maintain high reflectance by the DBR according to the exemplary embodiment.

The light emitting diode chip may further include an interface layer disposed between the substrate and the DBR and formed of the same material as the first material layers in the DBR, in which the interface layer has a greater thickness than the first material layers. The interface layer reduces influence of a rough bottom surface of the substrate to the DBR formed thereon.

The light emitting diode chip may further include a superficial layer disposed on an uppermost layer of the DBR so as to face the interface layer, in which the superficial layer is formed of the same material as the first material layers in the DBR and has a greater thickness than the first material layers. The superficial layer prevents the DBR from being damaged by a rough surface of a mounting plane of the light emitting diode chip upon packaging of the light emitting diode chip.

In some exemplary embodiments, the light emitting diode chip may further include a substrate disposed between the DBR and the light emitting structure to as to face the DBR. For example, the light emitting diode chip may be a flip-chip light emitting diode chip that allows light generated in the active layer to be discharged through the substrate after being reflected by the DBR.

In some exemplary embodiments, the active layer can generate blue light. Particularly, the active layer can emit light having a wavelength in the range of 425 nm to 475 nm, for example, blue light having a wavelength that is shorter than the central wavelength (554 nm) by about 100 nm.

As used herein, the terms "high index of refraction" and "low index of refraction" are used to indicate a difference in index of refraction between the first material layers and the second material layers. That is, the first material layers of a low index of refraction have a lower index of refraction than the second material layers of a high index of refraction. In one exemplary embodiment, the first material layers may be $SiO_2$ layers and the second material layers may be $TiO_2$ layers. For example, the $SiO_2$ layers may have an index of refraction of about 1.47 and the $TiO_2$ layers may have an index of refraction of about 2.41. It should be understood that the first material layers and the second material layers are not limited to the $SiO_2$ layers and the $TiO_2$ layers. So long as the first material layers and the second material layers have different indices of refraction and are optically transparent, not only insulation layers but also semiconductor layers may be used as the first and second material layers. Here, dielectric layers, such as the $SiO_2$ layers and the $TiO_2$ layers, are more suitable due to high light transmittance, easy deposition, and relatively large difference in index of refraction.

In accordance with another exemplary embodiment of the present invention, a light emitting diode chip includes: a light emitting structure including an active layer emitting light having a first wavelength; and a distributed Bragg reflector (DBR) disposed at one side of the light emitting structure so as to reflect light emitted from the light emitting structure. In this exemplary embodiment, the DBR includes first material layers having a low index of refraction and second material layers having a high index of refraction, in which the first and second material layers are alternately stacked one above another. With respect to a second wavelength (λ) longer than the first wavelength by 75 nm to 125 nm, the DBR includes a first region including a first group of first material layers having an optical thickness greater than 0.25λ+10% and a second group of first material layers having an optical thickness greater than 0.25λ−10% and less than 0.25λ+10% are alternately arranged; a second region including a third group of first material layers having an optical thickness less than 0.25λ−10% are consecutively arranged; and a third region disposed between the first region and the second region and including a first material layer having an optical thickness less than 0.25λ−10% and a first material layer having an optical thickness greater than 0.25λ, in which the first region is placed closer to the light emitting structure than the second region.

In the light emitting diode chip according to this exemplary embodiment, the second wavelength longer than the first wavelength of light emitted from the active layer by 75 nm to 125 nm is set as a reference wavelength (λ) for design of the DBR. The second wavelength may be 100 nm longer than the first wavelength. The wavelength of light emitted from the active layer may differ depending upon the material of the active layer. Accordingly, the DBR may be fabricated with reference to the second wavelength (λ), which is 100 nm longer than the first wavelength, in order to achieve effective reflection of light emitted from the active layer while maintaining high reflectance with respect to light entering the DBR at various angles of incidence DBR.

Hereinafter, exemplary embodiments of the present invention will be described in more detail with reference to the accompanying drawings.

Figure 4A:
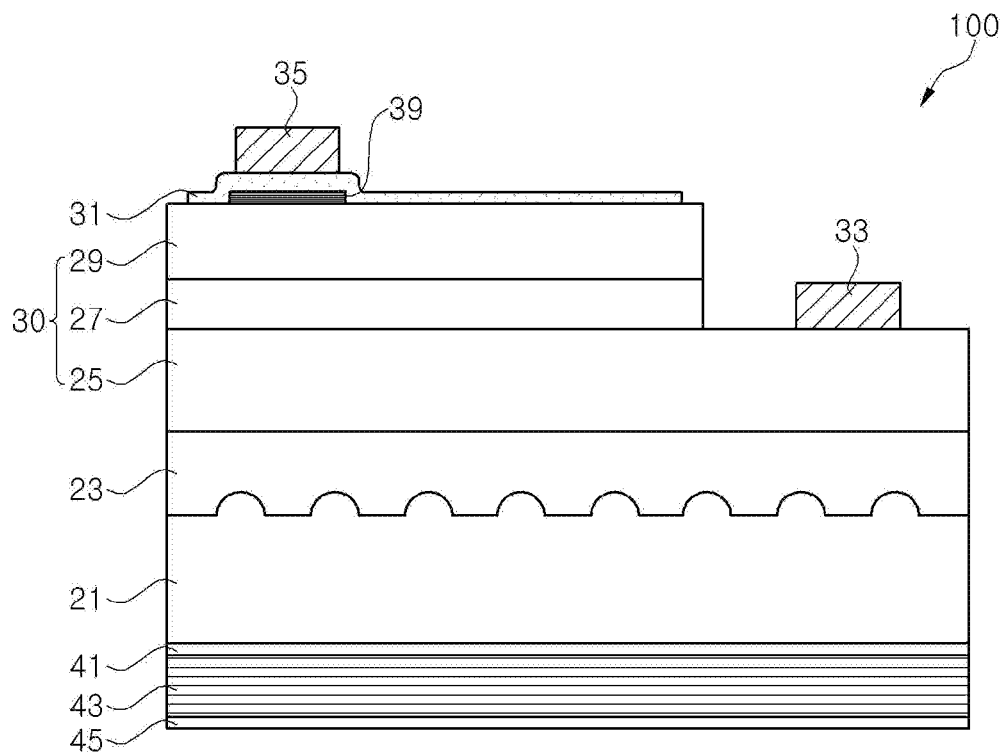
FIG. 4A is a sectional view of a light emitting diode chip according to an exemplary embodiment of the present invention.

FIG. 4A is a sectional view of a light emitting diode chip 100 according to an exemplary embodiment of the present invention.

Referring to FIG. 4A, the light emitting diode chip 100 includes a substrate 21, a light emitting structure 30, and a DBR 43. The light emitting diode chip 100 may further include a buffer layer 23, a transparent electrode 31, a first electrode pad 33, a second electrode pad 35, a current blocking layer 39, an interface layer 41, and a superficial layer 45.

The substrate 21 may be any transparent substrate without limitation, and may be, for example, a sapphire substrate or a SiC substrate. The substrate 21 may be a growth substrate suitable for growth of GaN-based compound semiconductor layers. For example, the substrate 21 may have a predetermined pattern formed on an upper surface thereof, like a patterned sapphire substrate (PSS). Since the patterned sapphire substrate generally allows light to enter a bottom surface thereof at an angle of incidence in the range of 20° to 50°, the DBR according to the illustrated embodiment of the present invention can more efficiently exhibit advantageous effects when applied thereto.

The light emitting structure 30 is disposed on an upper surface of the substrate 21. The light emitting structure 30 includes a first conductive-type semiconductor layer 25, a second conductive-type semiconductor layer 29, and an active layer 27 interposed between the first and second conductive-type semiconductor layers 25, 29. Here, the first conductive-type and the second conductive-type are opposite conductivity types, and the first conductive-type is an n-type and the second conductive-type is a p-type, or vice versa.

The first conductive-type semiconductor layer 25, the active layer 27, and the second conductive-type semiconductor layer 29 may be formed of GaN-based compound semiconductor materials, such as (Al, In, Ga)N. Compositional elements and a composition of the active layer 27 are determined, such that the active layer 27 can emit light having a desired wavelength, for example, UV light or blue light. As shown in the drawings, the first conductive-type semiconductor layer 25 and/or the second conductive-type semiconductor layer 29 may have a single layer structure or a multilayer structure. In addition, the active layer 27 may have a single quantum well structure or a multi-quantum well structure. Further, the buffer layer 23 may be interposed between the substrate 21 and the first conductive-type semiconductor layer 25.

The semiconductor layers 25, 27, 29 may be formed by MOCVD or MBE, and the first conductive-type semiconductor layer 25 may be subjected to patterning so as to expose some regions thereof through photolithography and etching.

The transparent electrode layer 31 may be formed on the second conductive-type semiconductor layer 29 using, for example, ITO, ZnO or Ni/Au. The transparent electrode layer 31 has lower specific resistance than the second conductive-type semiconductor layer 29, and thus, spreads electric current. The first electrode pad 33, for example, an n-electrode pad 33, is formed on the first conductive-type semiconductor layer 25, and the second electrode pad 35, for example, a p-electrode pad 35, is formed on the transparent electrode layer 31. As shown in the drawings, the p-electrode pad 35 may be electrically connected to the second conductive-type semiconductor layer 29 through the transparent electrode layer 31.

The current blocking layer 39 is disposed between the second electrode pad 35 and the second conductive-type semiconductor layer 29. The current blocking layer 39 may be disposed under the transparent electrode layer 31, or may be disposed on the transparent electrode layer 31. When the current blocking layer 39 is disposed between the transparent electrode layer 31 and the second electrode pad 35, the second electrode pad 35 may be electrically connected to the transparent electrode layer 31 through extension legs (not shown).

The current blocking layer 39 reflects light generated in the active layer 27 and traveling towards the second electrode pad 35. Such a current blocking layer 39 may be formed to have high reflectance with respect to light generated in the active layer 27, and may be composed of a distributed Bragg reflector, in which dielectric layers having different indices of refraction, for example, $TiO_2$ layers and $SiO_2$ layers, are alternately stacked one above another. This structure can prevent light loss due to absorption of light by the second electrode pad 35, thereby improving luminous efficacy of the light emitting diode chip.

The DBR 43 is disposed at a lower side of the substrate 21. That is, the substrate 21 is interposed between the light emitting structure 30 and the DBR 43. The DBR 43 is formed by alternately stacking first material layers having a first index of refraction (low index of refraction), for example, $SiO_2$ layers (n: about 1.47), and second material layers having a second index of refraction (high index of refraction), for example, $TiO_2$ layers (n: about 2.41). The stack structure of the DBR 43 will be described below in more detail with reference to FIG. 5.

The interface layer 41 may be interposed between the substrate 21 and the DBR 43. The interface layer 41 may be formed of the same material as the first material layer, for example, $SiO_2$. The interface layer 41 serves to prevent the DBR 43 formed on the bottom surface of the substrate 21 from being affected by the surface state of the bottom surface of the substrate 21, and is thicker than the first material layers. For example, the interface layer 41 may have a thickness of 300 nm to 500 nm, specifically 400 nm.

Furthermore, the superficial layer 45 may be formed as the uppermost layer of the DBR 43 so as to cover the DBR 43. The superficial layer 45 relieves influence on the DBR 43 by a surface state of a mounting plane, on which the light emitting diode chip 100 is mounted upon packaging of the light emitting diode chip 100, and is formed to a relatively high thickness, like the interface layer 41. For example, the superficial layer 45 may have a thickness of 300 nm to 500 nm, specifically 400 nm.

In this exemplary embodiment, the DBR 43 is disposed to face the light emitting structure 30 with the substrate 21 interposed therebetween. Light generated in the active layer 27 is reflected by the DBR 43 to be emitted upwards from the light emitting diode chip 100.

Figure 4B:
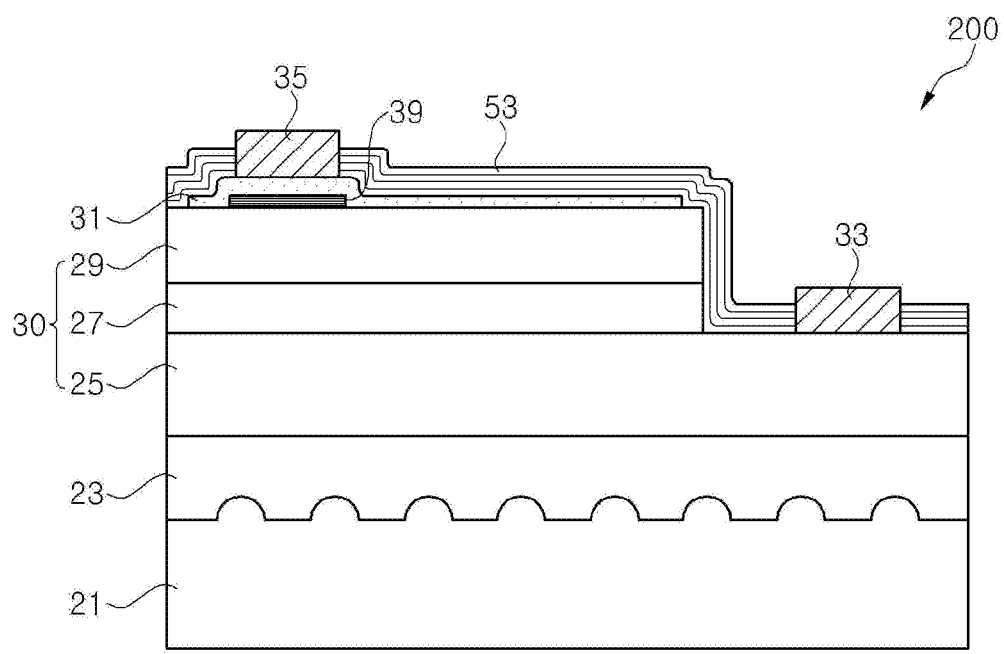
FIG. 4B is a sectional view of a light emitting diode chip according to another exemplary embodiment of the present invention.

FIG. 4B is a sectional view of a light emitting diode chip 200 according to another exemplary embodiment of the present invention.

Referring to FIG. 4B, in this exemplary embodiment, a DBR 53 is generally similar to the DBR 43 except that the DBR 53 is disposed to face the substrate 21 via the light emitting structure 30. As shown in this drawing, the DBR 53 may cover a transparent electrode layer 31 and an exposed surface of the first conductive-type semiconductor layer 25. The DBR 53 reflects light generated in the active layer 27 towards the substrate 21. The structure of the DBR 53 will be described below in more detail with reference to FIG. 5.

The light emitting diode chip 200 may be, for example, a flip-chip type light emitting diode chip. Thus, detailed shapes and locations of the transparent electrode layer 31, an n-electrode pad 33, and a p-the electrode pad 35 can be modified to be suited for the flip-chip type light emitting diode chip.

As described with reference to FIG. 4A and FIG. 4B, the DBR 43 or 53 may be formed on the lower surface of the substrate 21 or an upper surface of the light emitting structure 30. Although not shown, the DBR may be interposed between the substrate 21 and the light emitting structure 30 according to an exemplary embodiment. In this exemplary embodiment, the DBR may be formed by using, for example, semiconductor layers.

Figure 5:
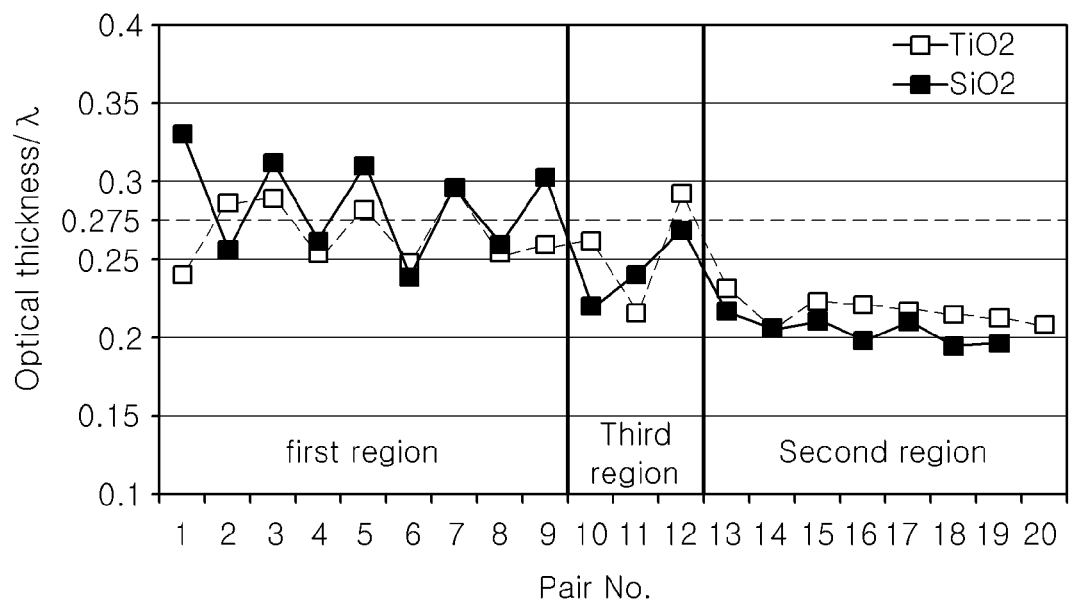
FIG. 5 is a graph depicting optical thicknesses of $TiO_2$/$SiO_2$ pairs depending upon locations for illustrating a DBR structure according to an exemplary embodiment of the present invention.

FIG. 5 is a graph depicting optical thicknesses of $TiO_2$/ $SiO_2$ pairs depending upon location for illustrating a DBR structure according to an exemplary embodiment of the present invention. Herein, the optical thickness refers to a thickness with respect to a central wavelength ($\lambda$: 554 nm) in the visible range.

The sequence of forming the first material layers and the second material layers may be changed according to conditions. For example, as in the exemplary embodiment shown in FIG. 4A, when the interface layer 41 is formed of the same material as the first material layers (for example, SiO$_2$), the first layer of the DBR 43 may be the second material layer. Alternatively, when the interface layer 41 is omitted, the first layer of the DBR 43 may be the first material layer. In addition, as in the exemplary embodiment shown in FIG. 4B, when the interface layer 41 is omitted, the first layer of the DBR 53 may be the first material layer or the second material layer. Generally, since adhesive strength of the SiO$_2$ layer is superior than the TiO$_2$ layer, the SiO$_2$ layer may be used as a layer bonded to the substrate 21 or the light emitting structure 30.

On the other hand, the superficial layer 45 formed on the surface of the DBR 43 or 53 has a relatively high thickness in order to protect the DBR 43 or 53, and may be formed of the same material as the first material layer. Accordingly, the last layer of the DBR 43 excluding the superficial layer 45 is generally the second material layer and does not form a pair.

FIG. 5 shows the DBR 43 interposed between the interface layer 41 and the superficial layer 45, in which the first layer and the last layer of the DBR 43 are the second material layers (TiO$_2$ layers). Here, the second material layer (TiO$_2$ layer)/first material layer (SiO$_2$ layer) constitute a pair, and the last second material layer does not form a pair.

Referring to FIG. 5, it can be confirmed that the structure of the DBR is clearly divided into a first region, a second region, and a third region. Here, the first region is placed closer to the light emitting structure 30 than the second region, and the third region is interposed between the first region and the second region.

[First Region]

The first region serves to increase reflectance near the central wavelength ($\lambda$) and in a spectrum region having a longer wavelength than the central wavelength ($\lambda$). Accordingly, in the first region, the first material layers and the second material layers generally have an optical thickness near 0.25$\lambda$ or greater than 0.25$\lambda$.

Specifically, in the first region, the first material layers (SiO$_2$ layers) are divided into a first group of first material layers having an optical thickness greater than 0.25$\lambda$+10% (0.275$\lambda$) and a second group of first material layers having an optical thickness greater than 0.25$\lambda$−10% and less than 0.25$\lambda$+10%. The first group of first material layers and the second group of first material layers are alternately arranged. As shown in FIG. 5, the first group of first material layers having a relatively high optical thickness and the second group of first material layers having a relatively small optical thickness are alternately arranged. The first group of first material layers may be formed prior to the second group of first material layers, or vice versa.

Furthermore, the first group of first material layers generally has an optical thickness less than 0.3$\lambda$+10% (3.3$\lambda$). In this exemplary embodiment, the first group includes five first material layers, and four layers excluding the first layer in the first group have an optical thickness less than 0.3$\lambda$+10%.

In the first region, the second material layers (for example, TiO$_2$ layers) include a first group of second material layers having an optical thickness greater than 0.25$\lambda$+10% (0.275$\lambda$) and a second group of second material layers having an optical thickness greater than 0.25$\lambda$−10% and less than 0.25$\lambda$+10%.

The optical thickness of the first group of second material layers is clearly distinguished from the optical thickness of the second group of second material layers. In addition, it can be seen that, although the first group of second material layers and the second group of second material layers are not completely alternately arranged, most of the first and second groups of second material layers are alternately arranged.

On the other hand, the first group of second material layers generally has a smaller optical thickness than the first group of first material layers. Further, the first group of second material layers has a smaller average optical thickness than the first group of first material layers. Since the second material layers having a higher index of refraction exhibit higher light absorption rate than the first material layers having a lower index of refraction, the first group of second material layers may be formed to a relatively small thickness in order to reduce light loss.

The first group of second material layers may have an optical thickness less than 0.25$\lambda$+20% (that is, 0.3$\lambda$). Conversely, the first group of first material layers generally has an optical thickness greater than 0.25$\lambda$+20%.

On the other hand, although the second group of second material layers may also have a smaller optical thickness than the second group of first material layers in order to reduce light loss, since the second group of second material layers has a smaller optical thickness than the first group of second material layers, reduction in thickness of the second group of second material layers does not provide a substantial effect in reduction of light loss. Thus, the second group of second material layers and the second group of first material layers may generally have a similar optical thickness.

[Second Region]

The second region is provided in order to increase reflectance in a spectrum region having a shorter wavelength than the central wavelength ($\lambda$). Accordingly, in the second region, the first material layers and the second material layers generally have an optical thickness less than 0.25$\lambda$.

Specifically, the second region includes a third group of first material layers having an optical thickness less than 0.25$\lambda$−10% and consecutively arranged. Furthermore, the third group of first material layers has an optical thickness greater than 0.2$\lambda$−10%.

Referring to FIG. 5, it can be clearly seen that an optical thickness deviation of the first material layers in the second region is smaller than the optical thickness deviation of the first material layers in the first region. Since the first group of first material layers and the second group of first material layers in the first region have clearly different optical thicknesses, the first material layers in the first region have a higher optical thickness deviation than the first material layers in the second region, which generally have a similar optical thickness.

In the second region, the second material layers include a third group of second material layers having an optical thickness less than 0.25$\lambda$−10% and consecutively arranged. In the second region, only the first one of the second material layer (that is, the second material layer in the thirteenth pair) has an optical thickness greater than 0.25$\lambda$−10% and all of other second material layers have optical thicknesses less than 0.25$\lambda$−10%.

[Third Region]

The third region is disposed between the first region and the second region in order to remove ripples, which are generated upon stacking DBRs having different reflection bands.

The third region is generally composed of a small number of pairs. As can be seen from FIG. 5, in this exemplary embodiment, the first region is composed of the largest number of pairs and the third region is composed of the smallest number of pairs.

Specifically, the third region includes a first material layer having an optical thickness less than 0.25λ−10% and a first material layer having an optical thickness greater than 0.25λ. Further, the third region may include a first material layer having an optical thickness greater than 0.25λ−10% and less than 0.25λ.

Furthermore, in the third region, the second material layers include a second material layer having an optical thickness less than 0.25λ−10% and a second material layer having an optical thickness greater than 0.25λ and less than 0.25λ+10%. Furthermore, in the third region, the second material layers may further include a second material layer having an optical thickness greater than 0.25λ+10%.

In the third layer composed of a relatively small number of pairs, the first material layers and the second material layers are formed to have more various optical thicknesses than the material layers in the first region and the second region.

According to this exemplary embodiment, the first and second material layers in the first region disposed relatively closer to the light emitting structure 30 and reflecting light in a long wavelength band are divided into the first group having a higher optical thickness and the second group having a smaller optical thickness, thereby removing ripples generated in the stop band even when the angle of incidence increases.

Although FIG. 5 shows that the first region is composed of 9 pairs, the second region is composed of 7.5 pairs, and the third region is composed of 3 pairs, it should be understood that the number of pairs can be changed in other exemplary embodiments. However, it is noted that the structure having greater number of pairs in the first region that in other regions is advantageous in compensation for reflectance in a long wavelength band.

The optical thickness of each layer constituting the DBR can be adjusted using a simulation tool, such as Macleod or Filmstar. In addition, each of the material layers of the DBR can be formed on the bottom surface of the substrate 21 or on the upper surface of the light emitting structure 30 using an ion assist deposition apparatus.

Figure 6A:
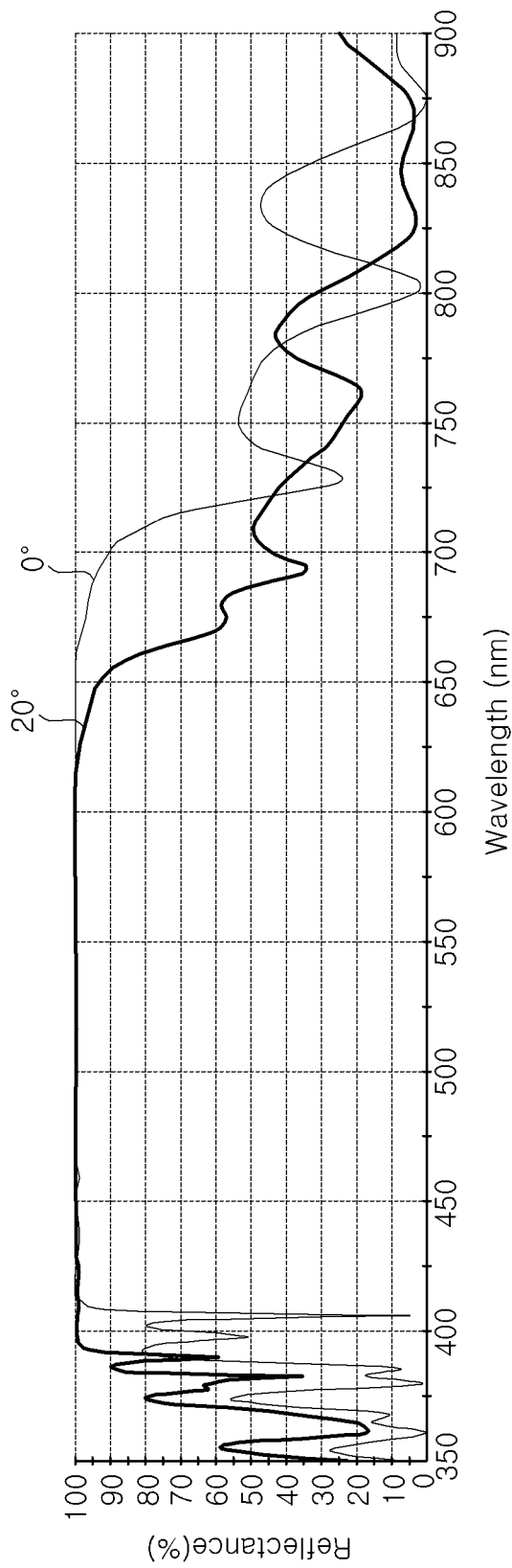
FIGS. 6A, 6B, and 6C are simulation graphs depicting variation in reflectance of a DBR depending upon an angle of incidence according to an exemplary embodiment of the present invention.
Figure 6B:
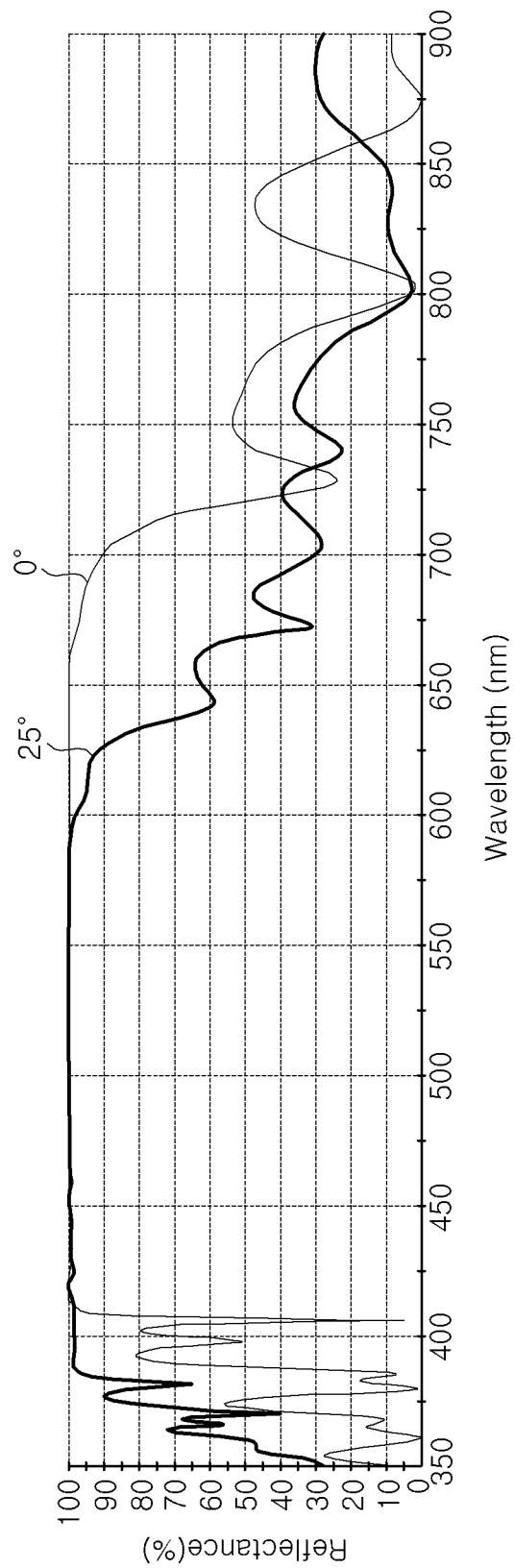
Figure 6C:
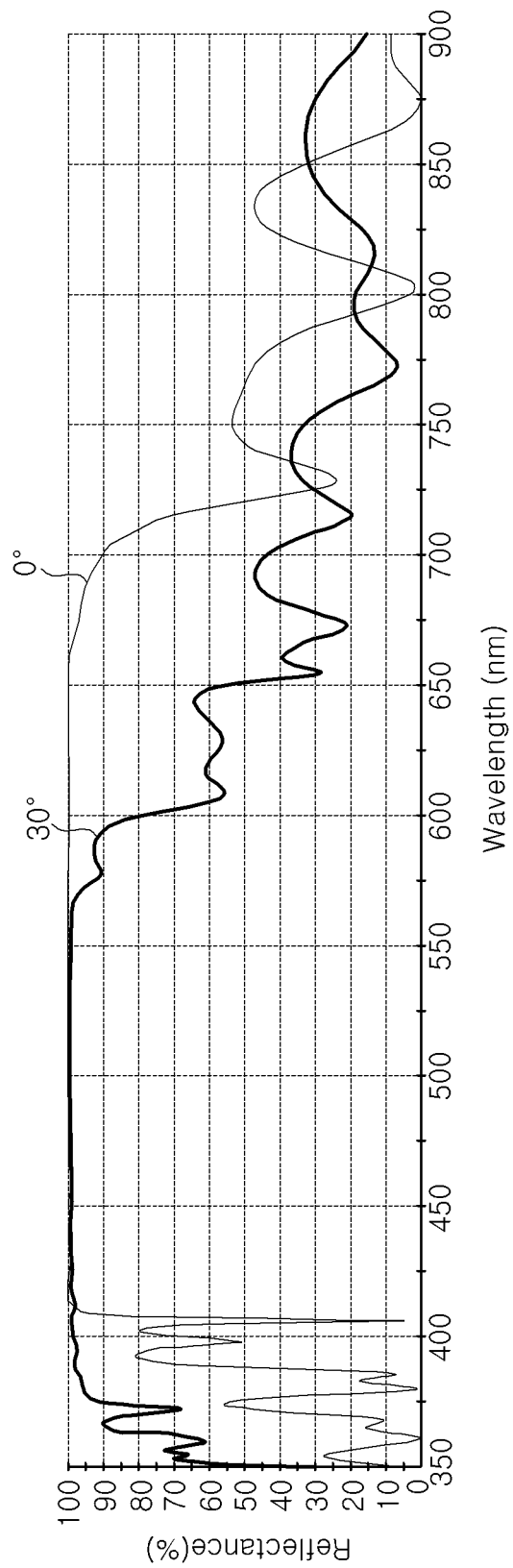

FIGS. 6A, 6B, and 6C are simulation graphs depicting variation in reflectance of a DBR depending upon an angle of incidence, as designed according to an exemplary embodiment of the present invention.

An optical thickness of each of the material layers of the DBR is shown in FIG. 5. In addition, a SiO$_2$ interface layer 41 having a thickness of 400 nm and a SiO$_2$ superficial layer 45 having a thickness of 400 nm were added in simulation of variation in reflectance depending upon an angle of incidence, and simulation results are shown together with reflectance at an angle of incidence of 0°.

Referring to FIGS. 6A, 6B, and 6C, the DBR according to this exemplary embodiment exhibits a reflectance of 90% or higher in a spectrum region of about 410 nm to 700 nm with respect to light entering at an angle of incidence of 0°. Accordingly, when the light emitting diode chip is used together with phosphors, light generated from the phosphors and entering the light emitting diode chip can be reflected using the DBR.

On the other hand, it can be seen that the stop band is shifted towards short wavelengths and the bandwidth of the stop band is narrowed with increasing angle of incidence to 20°, 25°, and 30°. However, it can be seen that the DBR according to this exemplary embodiment maintains a reflectance of substantially 100% at a wavelength of about 550 nm, and does not generate ripples in the stop band.

Accordingly, the DBR according to this exemplary embodiment can be used in order to achieve effective reflection of light in the light emitting diode chip, which emits blue light having a wavelength of, for example, 420 nm to 500 nm.

According this exemplary embodiment, in the first region of the DBR, a first group of first material layers having a higher optical thickness and a second group of first material layers having a smaller optical thickness are alternately arranged, and a first group of second material layers having a higher optical thickness and a second group of second material layers having a smaller optical thickness are also generally alternately arranged. As such, the DBR having the structure wherein the first and second material layers having different optical thicknesses are alternately arranged can exhibit superior reflection characteristics to the DBR having the structure wherein the first group and the second group are divided from each other. This will be described in more detail with reference to FIG. 7 and FIG. 8.

Figure 7A:
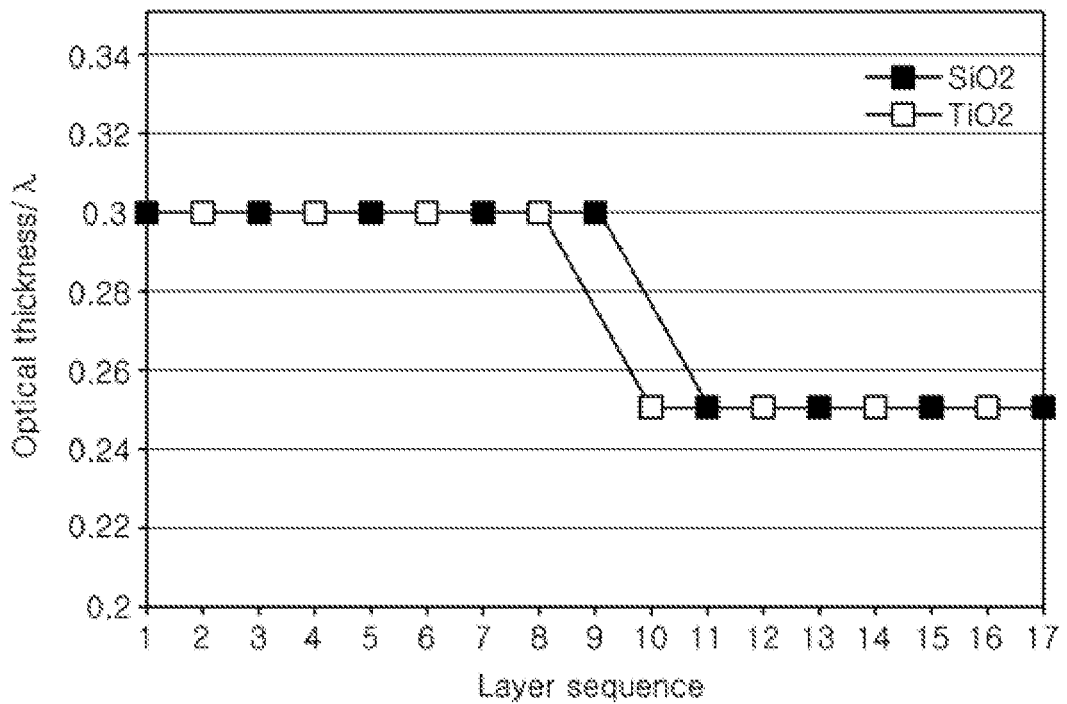
FIG. 7A is a graph depicting an optical thickness depending upon location, illustrating one example in which a first group of material layers having a higher optical thickness and a second group of material layers having a smaller optical thickness are divided from each other according to an exemplary embodiment of the present invention.
Figure 7B:
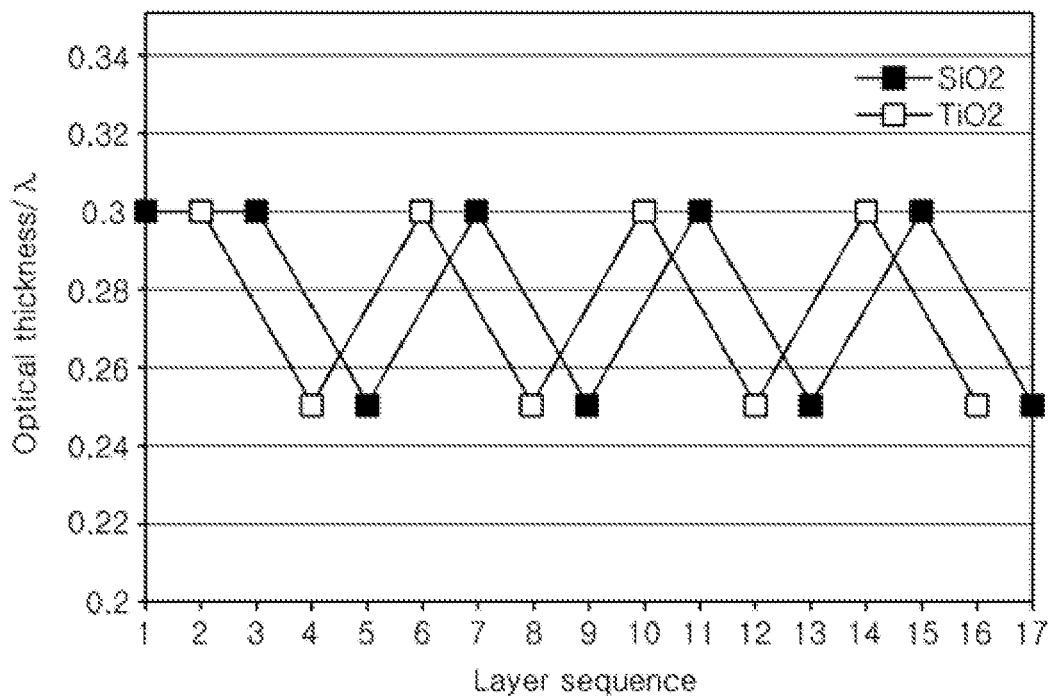
FIG. 7B is a graph depicting optical thickness depending upon location, illustrating one example in which a first group of material layers having a higher optical thickness and a second group of material layers having a smaller optical thickness are alternately arranged according to an exemplary embodiment of the present invention.

FIG. 7A is a graph depicting optical thickness depending upon location, illustrating one example in which a first group of material layers having a higher optical thickness and a second group of material layers having a smaller optical thickness are divided from each other. FIG. 7B is a graph depicting optical thickness depending upon location, illustrating one example in which a first group of material layers having a higher optical thickness and a second group of material layers having a smaller optical thickness are alternately arranged.

First groups of first material layers and second material layers each having an optical thickness of 0.3λ, and second groups of first material layers and second material layers each having an optical thickness of 0.25λ, may be arranged in various ways. For example, the first groups and the second groups may be arranged to be divided from each other (FIG. 7A) or may be alternately arranged (FIG. 7B). Here, the DBR is composed of 8.5 pairs as an example.

Figure 8:
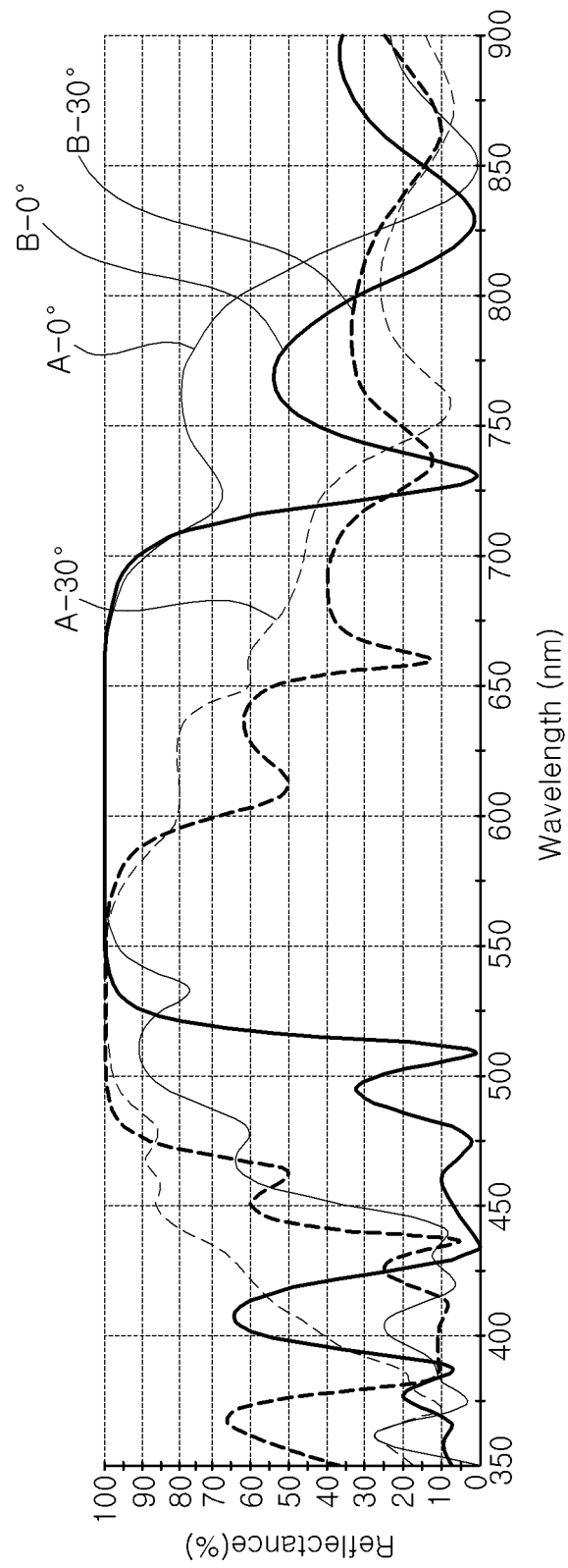
FIG. 8 is a graph depicting reflectance of DBRs of FIG. 7A and FIG. 7B depending upon an angle of incidence.

FIG. 8 is a graph depicting reflectance of DBRs of FIG. 7A and FIG. 7B depending upon an angle of incidence.

Referring to FIG. 8, the DBR of FIG. 7A provides a stop band in which reflectance A-0° at an angle of incidence of 0° does not have a clear boundary. Conversely, the DBR of FIG. 7B provides a stop band in which reflectance B-0° at an angle of incidence of 0° has a clear boundary. As indicated by A-30° and B-30° at an angle of incidence of 30°, the stop band of the DBR shown in FIG. 7B has a clearer boundary.

Accordingly, it can be seen that, in arrangement of material layers having different optical thicknesses, the structure wherein the material layers having a greater optical thickness and the material layers having a smaller optical thickness are alternately arranged can improve reflection characteristics.

On the other hand, light extraction efficiency at a chip level and at a package level were analyzed based on FDTD numerical analysis using a typical DBR and the DBR according to the exemplary embodiment of the invention. In this analysis, the DBR was set to be disposed on a lower surface of the substrate and other components had the same dimensions as those of an actual light emitting diode chip.

From this analysis, it could be seen that, at the chip level, overall light extraction efficiency was increased by about 0.25% in the case of using the DBR according to this exemplary embodiment (63.35%) as compared with the case of using the typical DBR (63.10%). In addition, at the chip level, light discharged through the lower surface of the substrate was 0.35% in case of using the typical DBR, and was decreased to 0.15% in case of using the DBR according to this exemplary embodiment. Further, it could be seen that, at the package level, overall light extraction efficiency was increased by about 0.53% in case of using the DBR according to this exemplary embodiment (63.53%) as compared with the case of using the typical DBR (65%). Such increase in light extraction efficiency occurs only through change of the DBR under the same conditions, and is a substantially significant result.

Figure 9:
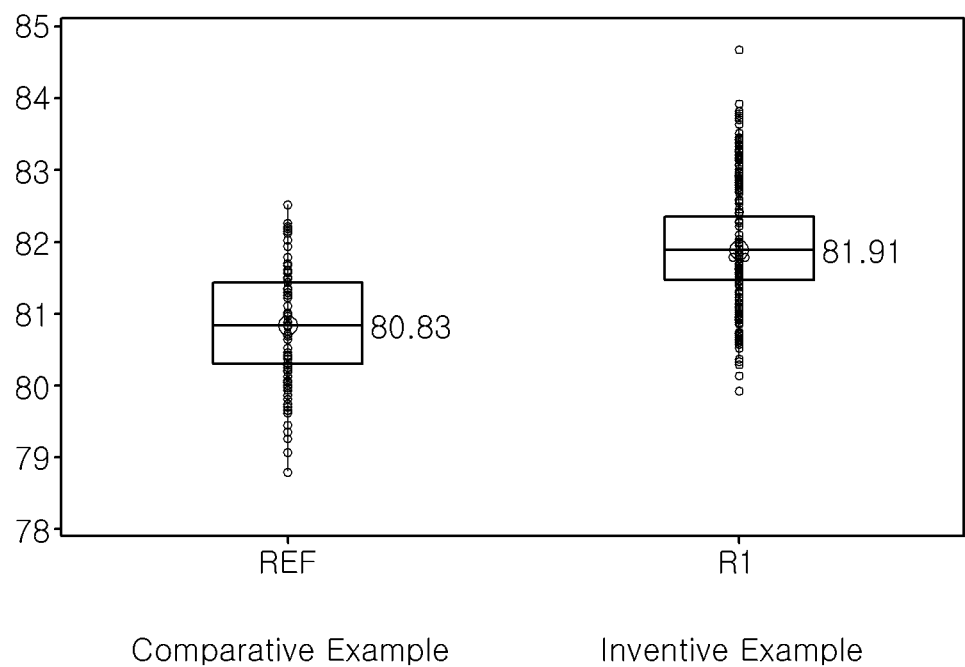
FIG. 9 is a graph depicting light output of a light emitting diode chip including a DBR according to an exemplary embodiment of the present invention.

FIG. 9 shows light outputs at the chip level using actual light emitting diode chips to which the typical DBR (Comparative Example) and the DBR according to the exemplary embodiment (Inventive Example) are applied.

Referring to FIG. 9, at 20 mA, the light emitting diode chip of the comparative example had an average light output of 80.83 mW, and the light emitting diode chip of the exemplary embodiment had an average light output of 81.91 mW. Accordingly, it can be seen that light extraction efficiency of the light emitting diode chip can be improved by changing the design of the DBR whereby the light output of the light emitting diode chip can be increased.

In this exemplary embodiment, the optical thickness of each of the material layers of the DBR is set with reference to the central wavelength of the visible range, that is, a wavelength of 554 nm. For the light emitting diode chip configured to emit blue light, establishment of the central wavelength of the visible range as the central wavelength is meaningful, when considering that the stop band is shifted towards short wavelengths with increasing angle of incidence. Furthermore, when the light emitting diode chip is used together with the phosphors, the DBR is required to be designed with reference to the central wavelength, when considering reflection with respect to light emitted through the phosphors.

However, it should be understood that the inventive concepts are not limited to the light emitting diode chip configured to emit blue light and to the structure including the phosphors together with the light emitting diode chip. Accordingly, the inventive concepts may also be applied to a light emitting diode chip configured to emit UV light and, in this case, a new reference wavelength (second wavelength) may be selected, instead of the central wavelength of the visible range, by taking into account a wavelength (first wavelength) of light emitted from the light emitting diode chip.

The second wavelength may be longer than the first wavelength by 75 nm to 125 nm. Even when the stop band is shifted towards short wavelengths with increasing angle of incidence, the DBR can maintain high reflectance with respect to light emitted from the light emitting diode chip by setting the second wavelength in this way. If the second wavelength is longer than the first wavelength by less than 75 nm, the first wavelength is too close to the second wavelength, and thus, the DBR can suffer from reduction in reflectance with respect to light having the first wavelength as the angle of incidence increases. If the second wavelength is longer than the first wavelength by 125 nm or more, there can be difficulty in fabrication of a DBR having high reflectance with respect to light having the first wavelength at an angle of incidence of 0°. Specifically, the second wavelength may be longer than the first wavelength by about 100 nm.

Except that the second wavelength is set as the reference wavelength instead of the central wavelength 554 nm, the optical thickness of each of the first material layers and the second material layers may be set as described above.

Herein, although the $SiO_2$ layer and the $TiO_2$ layer are illustrated as the first material layer and the second material layer, respectively, it should be understood that the inventive concepts are not limited thereto, and other insulation layers or semiconductor layers may also be used as the first and second material layers.

Figure 10:
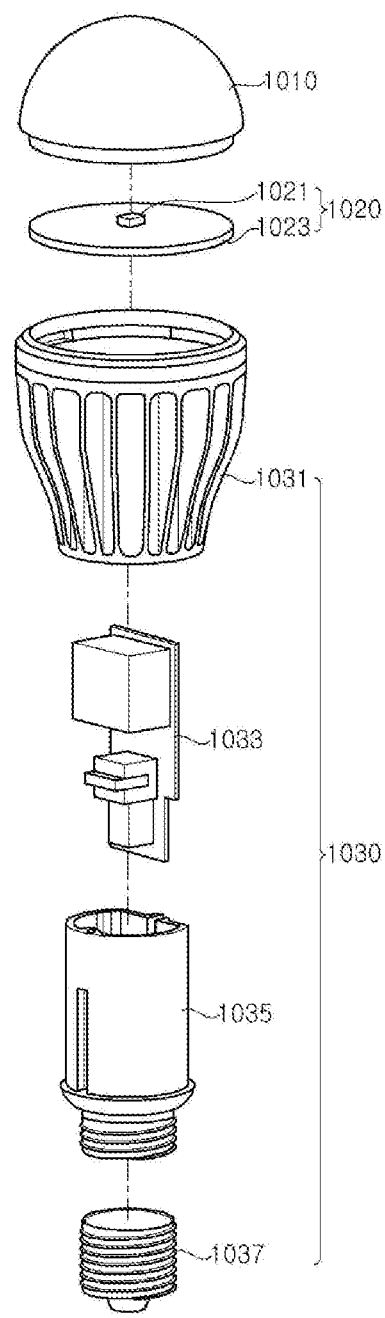
FIG. 10 is an exploded perspective view of a lighting apparatus including a light emitting diode chip according to an exemplary embodiment of the invention.

FIG. 10 is an exploded perspective view of a lighting apparatus including a light emitting diode chip according to an exemplary embodiment of the invention.

Referring to FIG. 10, the lighting apparatus according to this embodiment includes a diffusive cover 1010, a light emitting diode module 1020, and a body 1030. The body 1030 may receive the light emitting diode module 1020, and the diffusive cover 1010 may be disposed on the body 1030 to cover an upper side of the light emitting diode module 1020.

The body 1030 may have any shape so long as the body can supply electric power to the light emitting diode module 1020, while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change, or control electric power supplied to the light emitting diode module 1020. The power supply case 1035 may receive and support the power supply 1033. The power supply case 1035 having the power supply 1033 secured therein may be disposed within the body case 1031. The power source connection section 1037 is disposed at a lower end of the power supply case 1035 and coupled thereto. Accordingly, the power source connection section 1037 is electrically connected to the power supply 1033 within the power supply case 1035 and may serve as a passage through which power can be supplied from an external power source to the power supply 1033.

The light emitting diode module 1020 includes a substrate 1023 and a light emitting diode chip 1021 disposed on the substrate 1023. The light emitting diode module 1020 may be disposed at an upper portion of the body case 1031 and electrically connected to the power supply 1033.

As the substrate 1023, any substrate capable of supporting the light emitting diode chip 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode chip 1021 may include at least one of the light emitting diode chips according to the embodiments described above.

The diffusive cover 1010 is disposed on the light emitting diode chip 1021 and may be secured to the body case 1031 to cover the light emitting diode chip 1021. The diffusive cover 1010 may be formed of a light-transmitting material and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 11:
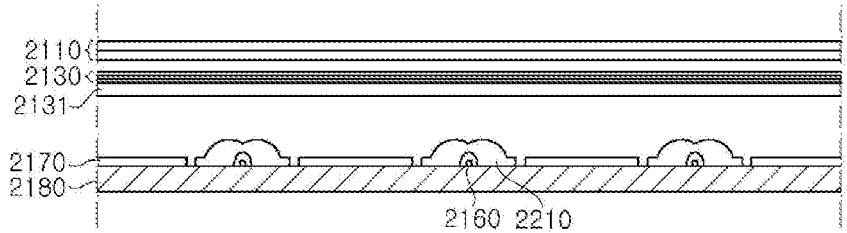
FIG. 11 is a sectional view of a display including a light emitting diode chip according to an exemplary embodiment of the invention.

FIG. 11 is a sectional view of a display including a light emitting diode chip according to an exemplary embodiment of the invention.

The display according to this embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the edge of the display panel 2110 to supply driving signals to a gate line. Here, the gate driving PCBs may be formed on a thin film transistor substrate, instead of being formed on separate PCBs.

The backlight unit includes a light source module, which includes at least one substrate and a plurality of light emitting diode chips 2160. The backlight unit may further include a bottom cover 2180, a reflective sheet 2170, a diffusive plate 2131, and optical sheets 2130.

The bottom cover 2180 may be opened at an upper side thereof to receive the substrate, the light emitting diode chips 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated onto a surface thereof, the substrate may be disposed on the reflective sheet 2170. Further, a plurality of substrates may be arranged parallel to one other. However, it should be understood that other implementations are also possible and the light source module may include a single substrate.

The light emitting diode chips 2160 may include at least one of the light emitting diode chips according to the embodiments described above. The light emitting diode chips 2160 may be regularly arranged in a predetermined pattern on the substrate. In addition, a lens 2210 may be disposed on each of the light emitting diode chips 2160 to improve uniformity of light emitted from the plurality of light emitting diode chips 2160.

The diffusive plate 2131 and the optical sheets 2130 are disposed on the light emitting devices 2160. Light emitted from the light emitting devices 2160 may be supplied in the form of sheet light to the display panel 2110 through the diffusive plate 2131 and the optical sheets 2130.

In this way, the light emitting diode chips according to the exemplary embodiments may be applied to direct type displays like the display according to this embodiment.

Figure 12:
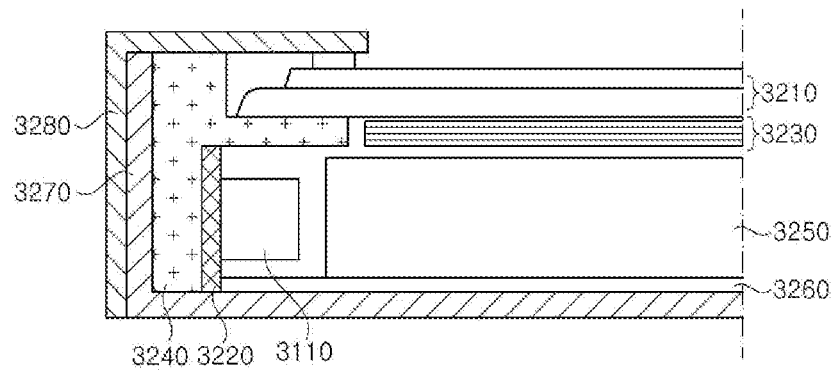
FIG. 12 is a sectional view of a display including a light emitting diode chip according to an exemplary embodiment of the invention.

FIG. 12 is a sectional view of another exemplary embodiment of a display including a light emitting diode chip according to one exemplary embodiment of the invention.

The display according to this exemplary embodiment includes a display panel 3210 on which an image is displayed, and a backlight unit disposed at a rear side of the display panel 3210 and emitting light thereto. Further, the display includes a frame supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially opened at an upper side thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diode chips according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diode chips according to the exemplary embodiments may be applied to edge type displays like the display according to this exemplary embodiment.

Figure 13:
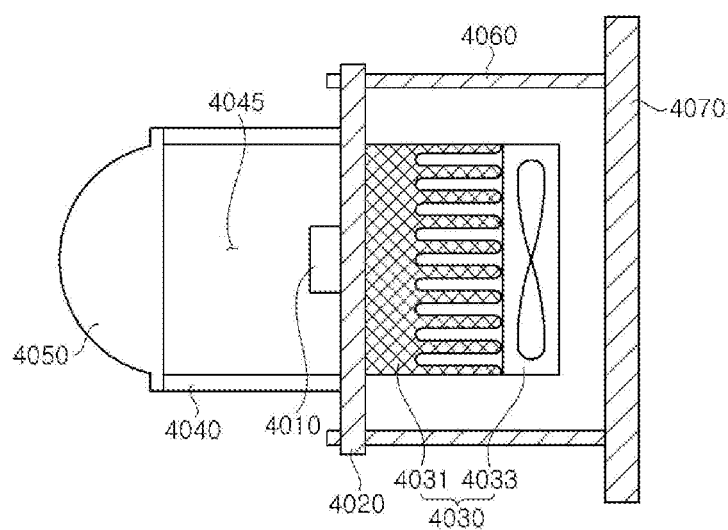
FIG. 13 is a sectional view of a headlight including a light emitting diode chip according to one exemplary embodiment of the invention.

FIG. 13 is a sectional view of a headlight including a light emitting diode chip according to an exemplary embodiment of the invention.

Referring to FIG. 13, the headlight according to this exemplary embodiment includes a lamp body 4070, a substrate 4020, a light emitting diode chip 4010, and a cover lens 4050. The headlight may further include a heat dissipation unit 4030, a support rack 4060, and a connection member 4040.

The substrate 4020 is secured by the support rack 4060 and disposed above the lamp body 4070. As the substrate 4020, any member capable of supporting the light emitting diode chip 4010 may be used without limitation. For example, the substrate 4020 may include a substrate having a conductive pattern, such as a printed circuit board. The light emitting diode chip 4010 is disposed on the substrate 4020 and may be supported and secured by the substrate 4020. In addition, the light emitting diode chip 4010 may be electrically connected to an external power source through the conductive pattern of the substrate 4020. Further, the light emitting diode chip 4010 may include at least one of the light emitting diode chips according to the exemplary embodiments described above.

The cover lens 4050 is disposed on a path of light emitted from the light emitting diode chip 4010. For example, as shown in the drawing, the cover lens 4050 may be spaced apart from the light emitting diode chip 4010 by the connection member 4040, and may be disposed in a direction of supplying light emitted from the light emitting diode chip 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode chip 4010, and thus may act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033, and dissipates heat generated upon operation of the light emitting diode chip 4010.

In this way, the light emitting diode chips according to the exemplary embodiments may be applied to headlights, particularly, headlights for vehicles, like the headlight according to this exemplary embodiment.

According to exemplary embodiments, a distributed Bragg reflector exhibits good reflectance with respect not only to light entering at a right angle but also to light entering at various angles of incidence, thereby improving luminous efficacy of a light emitting diode chip including the same. Particularly, according to the exemplary embodiments, the DBR can prevent or suppress generation of ripples exhibiting low reflectance with increasing angle of incidence in the stop band, thereby improving luminous efficacy of the light emitting diode chip. Furthermore, with the light emitting diode chip including the DBR, a light emitting diode package and a lighting apparatus have improved luminous efficacy.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A light emitting apparatus comprising:
a bottom cover having an upper side;
a circuit substrate disposed on the bottom cover;
a reflective layer disposed on the circuit substrate; and
light sources arranged in a predetermined pattern on the circuit substrate, each of the light sources including:
a substrate;
a light emitting layer disposed on the substrate and comprising an active layer;
a transparent electrode disposed on the light emitting layer;
a distributed Bragg reflector (DBR) disposed on a lower side of the substrate; and
a superficial layer disposed on a lower side of the DBR;
lenses disposed on the light sources, respectively,
wherein the DBR includes first material layers having a low index of refraction and second material layers having a high index of refraction alternately disposed one over another,
wherein the substrate is disposed between the DBR and the light emitting layer,
wherein a peripheral region of the light sources is surrounded by the reflective layer,
wherein the DBR includes a region that a value of a reference wavelength multiplied with 0.25 is different than a value of one of a thickness of the first material layers multiplied with the low index of refraction and a value of one of a thickness of the second material layers multiplied with the high index of refraction,
wherein the reference wavelength is 554 nm,
wherein the superficial layer and the first material layers include a same material, and
wherein one of the second material layers of the DBR contacts with the superficial layer, and the superficial layer is thicker than the one of the second material layers.

2. The light emitting apparatus according to claim 1, further comprising a first electrode pad and a second electrode pad, wherein:
the first electrode pad is formed on a first conductive-type semiconductor layer; and the second electrode pad is formed on the transparent electrode.

3. The light emitting apparatus according to claim 1, wherein the substrate comprises patterned sapphire substrate (PSS).

4. The light emitting apparatus according to claim 1, further comprising an interface layer comprising the same material as the first material layers in the DBR and having a greater thickness than the first material layers.

5. The light emitting apparatus according to claim 1, wherein the first material layers comprise $SiO_2$ layers and the second material layers comprise $TiO_2$ layers.

6. The light emitting apparatus according to claim 1, further comprising a diffusion plate disposed on the lenses.

7. The light emitting apparatus according to claim 6, wherein the circuit substrate includes a plurality of circuit substrates, and the diffusion plate cover the plurality of circuit substrates at once.

8. The light emitting apparatus according to claim 6, further comprising an optical sheet disposed on the diffusion plate.

9. A light emitting apparatus comprising:
a bottom cover having an upper side;
a plurality of circuit substrates disposed on the bottom cover;
a reflective layer disposed on the plurality of circuit substrates;
a diffusion plate disposed on the circuit substrates; and
light sources arranged in a predetermined pattern on the plurality of circuit substrates, each of the light sources including:
a substrate;
a light emitting layer disposed on the substrate and comprising an active layer; a transparent electrode disposed on the light emitting layer;
a distributed Bragg reflector (DBR) disposed on a lower side of the substrate; and
a superficial layer disposed on a lower side of the DBR;
lenses disposed on the light sources, respectively,
wherein the diffusion plate covers the plurality of circuit substrates at once,
wherein the DBR includes first material layers having a low index of refraction and second material layers having a high index of refraction alternately disposed one over another,
wherein the substrate is disposed between the DBR and the light emitting layer,
wherein a peripheral region of the substrate disposed between the light sources is covered by the reflective layer,
wherein the DBR includes a region that a value of a reference wavelength multiplied with 0.25 is different than a value of one of a thickness of the first material layers multiplied with the low index of refraction and a value of one of a thickness of the second material layers multiplied with the high index of refraction,
wherein the reference wavelength is 554 nm,
wherein the superficial layer and the first material layers include a same material, and
wherein one of the second material layers of the DBR contacts with the superficial layer, and the superficial layer is thicker than the one of the second material layers.

10. The light emitting apparatus according to claim 9, wherein the substrate comprises patterned sapphire substrate (PSS).

11. The light emitting apparatus according to claim 9, further comprising an interface layer comprising the same material as the first material layers in the DBR and having a greater thickness than the first material layers.

12. The light emitting apparatus according to claim 9, wherein the first material layers comprise SiO2 layers and the second material layers comprise TiO2 layers.

13. The light emitting apparatus according to claim 9, further comprising an optical sheet disposed on the diffusion plate.

14. A light emitting apparatus comprising:
a bottom cover having an upper side;
a plurality of circuit substrates disposed on the bottom cover;
a reflective layer disposed on the plurality of circuit substrates;
an optical sheet disposed on the circuit substrates; and
light sources arranged in a predetermined pattern on the plurality of circuit substrates, each of the light sources including:
a substrate;
a light emitting layer disposed on the substrate and comprising an active layer; a transparent electrode disposed on the light emitting layer;
a distributed Bragg reflector (DBR) disposed on a lower side of the substrate; and
a superficial layer disposed on a lower side of the DBR;
lenses disposed on the light sources, respectively,
wherein the optical sheet covers the plurality of circuit substrates at once,
wherein the DBR includes first material layers having a low index of refraction and second material layers having a high index of refraction alternately disposed one over another,
wherein the substrate is disposed between the DBR and the light emitting layer, and a region between the light sources is covered by the reflective layer,
wherein the DBR includes a region that a value of a reference wavelength multiplied with 0.25 is different than a value of one of a thickness of the first material layers multiplied with the low index of refraction and a value of one of a thickness of the second material layers multiplied with the high index of refraction,
wherein the reference wavelength is 554 nm,
wherein the superficial layer and the first material layers include a same material, and
wherein one of the second material layers of the DBR contacts with the superficial layer, and the superficial layer is thicker than the one of the second material layers.

15. The light emitting apparatus according to claim 14, wherein the substrate comprises patterned sapphire substrate (PSS).

16. The light emitting apparatus according to claim 14, further comprising an interface layer comprising the same material as the first material layers in the DBR and having a greater thickness than the first material layers.

17. The light emitting apparatus according to claim 14, wherein the first material layers comprise SiO2 layers and the second material layers comprise TiO2 layers.

18. The light emitting apparatus according to claim 14, wherein the reflective layer is disposed between the plurality of circuit substrates and the optical sheet.

19. The light emitting apparatus according to claim 18, further comprising a diffusion plate disposed between the reflective layer and optical sheet.

* * * * *